(12) United States Patent
Schade et al.

(10) Patent No.: US 12,104,305 B2
(45) Date of Patent: Oct. 1, 2024

(54) PROXIMITY CONTROL DEVICE AND DOMESTIC ELECTRICAL APPLIANCE EQUIPPED THEREWITH

(71) Applicant: emz-Hanauer GmbH & Co. KGaA, Nabburg (DE)

(72) Inventors: Lukas Schade, Nabburg (DE); Martin Brabec, Nabburg (DE); Manfredi Signorino, Wackersdorf (DE); Josef Irlbacher, Nabburg (DE); Günter Zühlke, Stulln (DE)

(73) Assignee: EMZ-HANAUER GMBH & CO. KGAA, Nabburg (DE)

( * ) Notice: Subject to any disclaimer, the term of this patent is extended or adjusted under 35 U.S.C. 154(b) by 395 days.

(21) Appl. No.: 17/533,790

(22) Filed: Nov. 23, 2021

(65) Prior Publication Data

US 2022/0170971 A1 Jun. 2, 2022

(30) Foreign Application Priority Data

Nov. 27, 2020 (DE) .......................... 102020131516.3

(51) Int. Cl.
*D06F 34/20* (2020.01)
*D06F 34/14* (2020.01)
*D06F 103/00* (2020.01)
*D06F 105/44* (2020.01)
*G01R 27/26* (2006.01)

(52) U.S. Cl.
CPC .............. *D06F 34/20* (2020.02); *D06F 34/14* (2020.02); *D06F 2103/00* (2020.02); *D06F 2105/44* (2020.02); *G01R 27/2605* (2013.01)

(58) Field of Classification Search
CPC ...... D06F 34/20; D06F 34/14; D06F 2103/00; D06F 2105/44
See application file for complete search history.

(56) References Cited

U.S. PATENT DOCUMENTS

| | | | |
|---|---|---|---|
| 6,847,289 B2 | 1/2005 | Pang et al. | |
| 2002/0175814 A1* | 11/2002 | Wadlow | G08B 13/26 340/562 |
| 2011/0260553 A1* | 10/2011 | Poyner | A47L 15/0049 307/115 |

(Continued)

FOREIGN PATENT DOCUMENTS

| | | |
|---|---|---|
| DE | 102013102469 A1 | 10/2014 |
| EP | 584271 A1 | 4/2013 |

*Primary Examiner* — Joseph L. Perrin
(74) *Attorney, Agent, or Firm* — Hayes Soloway PC

(57) ABSTRACT

A capacitive proximity control device (28) for a domestic washing machine (10) or other domestic electrical appliance is proposed. In some embodiments, the proximity control device comprises two planar sensor electrodes (34, 36) arranged on a door (20) of the washing machine at a spatial distance from one another. An electronic assembly is connected to the two sensor electrodes, which electronic assembly is adapted to generate, in association with each of the two sensor electrodes, an electrical sensor signal which is representative of a change in a capacitance associated with the sensor electrode in question. By mutual correlation of the two sensor signals, the electronic assembly is able to determine a proximity operation of the control device. A shielding electrode can be arranged in the spatial region between the two sensor electrodes.

6 Claims, 3 Drawing Sheets

(56) References Cited

U.S. PATENT DOCUMENTS

| | | | | |
|---|---|---|---|---|
| 2013/0099715 | A1* | 4/2013 | Fuhge | E05F 15/79 |
| | | | | 318/484 |
| 2014/0152327 | A1* | 6/2014 | Erkens | G01R 27/2605 |
| | | | | 324/658 |
| 2015/0345065 | A1* | 12/2015 | Yang | G05B 15/02 |
| | | | | 700/275 |
| 2016/0116891 | A1* | 4/2016 | Megger | G06F 3/0304 |
| | | | | 700/275 |
| 2020/0043494 | A1* | 2/2020 | Maeng | G10L 15/22 |
| 2020/0348905 | A1* | 11/2020 | Fischer | D06F 34/08 |
| 2020/0362497 | A1* | 11/2020 | Park | G06F 3/041 |

* cited by examiner

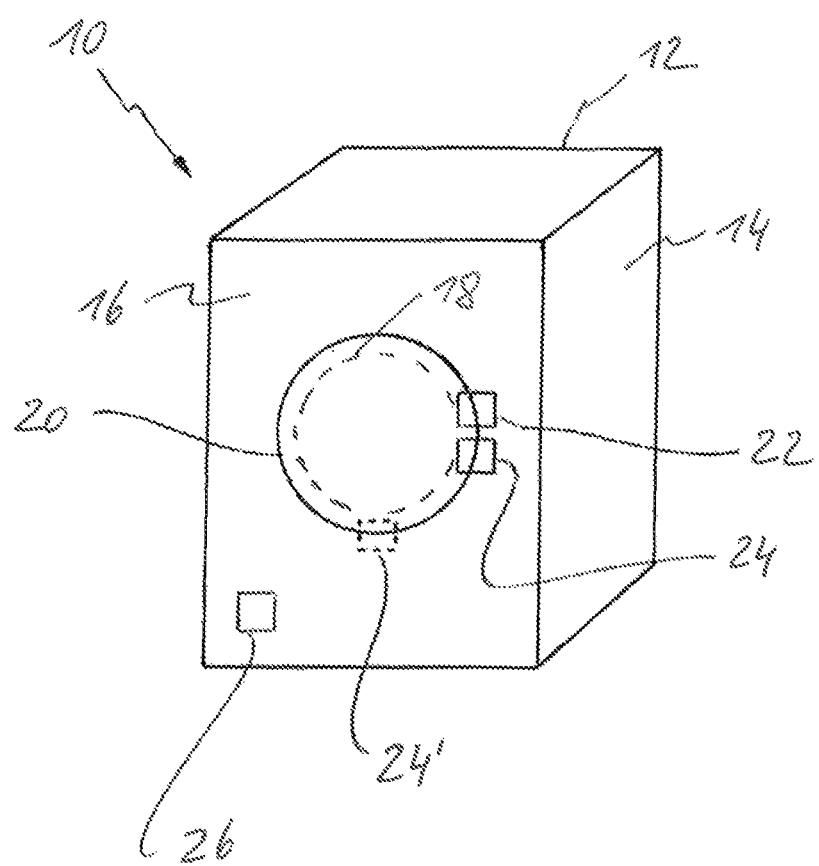

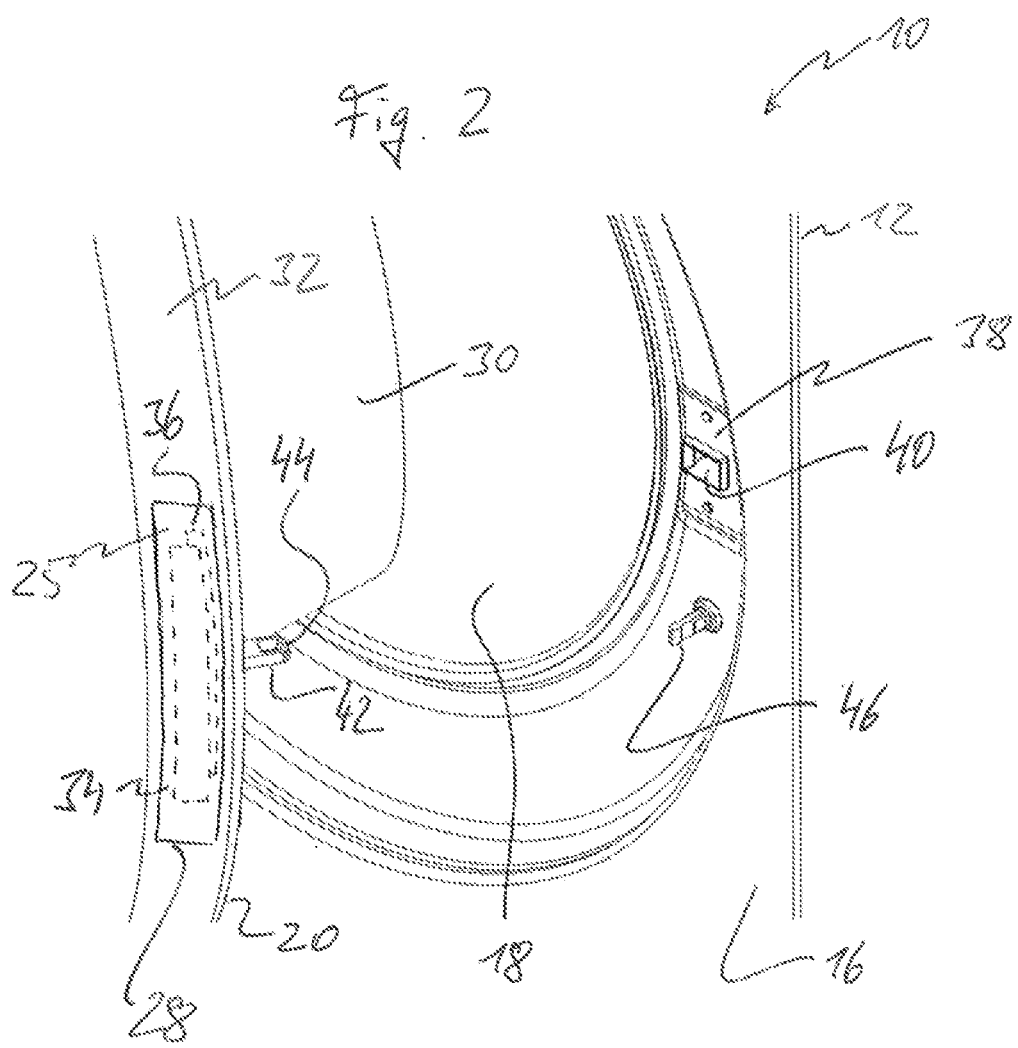

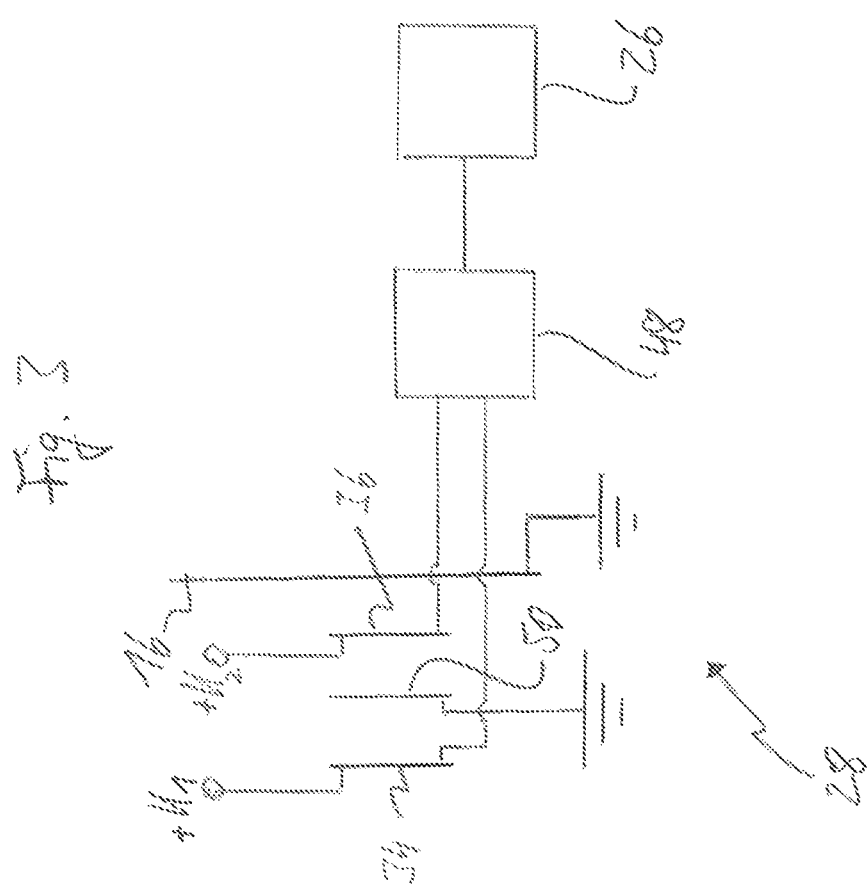

PROXIMITY CONTROL DEVICE AND DOMESTIC ELECTRICAL APPLIANCE EQUIPPED THEREWITH

The invention relates to a proximity control device and to a domestic electrical appliance equipped therewith.

Domestic electrical appliances such as, for example, machines for cleaning or/and drying items of clothing, machines for cleaning dishes, or ovens or cookers for heating or/and cooking foods are generally equipped with manually operable control elements by means of which a user can manually control the appliance in question. Such control elements exist in the form of, for example, push buttons and dials for controlling operation of the domestic appliance, but also, for example, in the form of hinged elements for opening a door of the domestic appliance.

Capacitive proximity sensors work by the principle that, by moving an object into the electric field of an (open) capacitor, the capacitance of the capacitor changes. Such capacitance changes can be detected by means of an electrical oscillator circuit, the oscillation frequency of which changes in dependence on the capacitor capacitance. By evaluating the oscillation frequency, the approach of an object to the proximity sensor can thus be detected. Proximity sensors can be used, for example, as proximity switches for detecting an approaching hand or part of the hand of a user and are thus one possible way of realizing a control element of a domestic electrical appliance.

Many domestic electrical appliances have an appliance housing, the housing walls of which are at least in part metallic and thus electrically conducting. The presence of metallic walls in the region of the electric field of a capacitive proximity sensor can influence the field of the sensor. In addition, vibrations of the housing walls can lead to changes in the relative distance between the housing walls and the active capacitor electrode of the proximity sensor. This can result in capacitance changes of the proximity sensor, which may erroneously be detected by an evaluation electronics as the approach of an object, even though no object has approached the proximity sensor.

It is an object of the invention to provide a proximity control device which, in the operational environment of a domestic electrical appliance, permits reliable detection of a proximity control gesture of a user and consequently reliable control of the domestic appliance.

In order to achieve this object, the invention provides a proximity control device for a domestic electrical appliance, the proximity control device comprising: a pair of planar sensor electrodes arranged with a mutual spatial distance; and an electronic assembly connected to the two sensor electrodes, wherein the electronic assembly is configured to generate, in association with each of the pair of sensor electrodes, an electrical sensor signal which is representative of a change in a capacitance associated with the respective sensor electrode and, by mutual correlation of the two sensor signals, to determine a proximity operation of the control device.

According to the present invention, each of the pair of sensor electrodes forms a capacitor electrode of a plate-type capacitor. For each of the two sensor electrodes, a sensor signal is generated by the electronic assembly, for example by means of a suitable oscillator circuit, which sensor signal represents capacitance changes of the plate-type capacitor in question. The sensor signal can be, for example, an analog current or voltage signal; alternatively, it can be a digital signal, the digitally represented signal value of which is representative of the capacitor capacitance or of a parameter derived therefrom (e.g. oscillation frequency of an oscillator circuit). A constant electric potential of several volts, for example between approximately 1.8 V and 5 V, can be applied to the two sensor electrodes, wherein it is conceivable to apply the same electric potential or a different electric potential to each of the two sensor electrodes.

Although the two sensor electrodes are at a spatial distance from one another, at least in some embodiments they are nevertheless arranged sufficiently close to one another that, when a manual proximity control gesture is performed properly (e.g. when a finger or other part of the hand of a user is moved in the proper manner closer to a specified control surface of the proximity control device for the purpose of operation thereof), the two sensor signals show a signal curve in which the control gesture is reflected. In these embodiments, information about the proximity control gesture should thus be contained in both sensor signals, for example in the signal magnitude or/and in the temporal signal curve. However, the information about the proximity control gesture can be contained in the two sensor signals with different characteristics, namely, for example, with a different intensity or/and with a different time pattern.

In some exemplary embodiments it can be provided that one of the sensor electrodes is arranged spatially closer to the control surface of the proximity control device than the other of the sensor electrodes. With such a relative arrangement of the sensor electrodes in relation to the control surface it is possible, for example, for the operating gesture to be reflected in signal changes of the two sensor signals in the same direction, wherein, however, the signal amplitude of the sensor signal of one sensor electrode is significantly greater than the corresponding amplitude of the sensor signal of the other sensor electrode. Conversely, it can be provided that the sensor electrode that is arranged closer to the control surface is at the same time arranged further away than the other sensor electrode from a metallic component of the domestic appliance (e.g. from a metallic housing wall) that is considered to be a potential electrical interference factor for the sensor signals. As a result, although vibrations of the metallic component are again reflected in signal changes of both sensor signals in the same direction, the intensity of these signal changes is significantly weaker in the sensor signal of one sensor electrode than in the sensor signal of the other sensor electrode.

In more general terms, the proximity control device can be designed, in particular by the form and mutual spatial position of the sensor electrodes, such that a proximity control gesture and also vibrations of a close metal component affect the sensor signals significantly differently in each case. For example, one of the sensor electrodes can serve as a "hand electrode", as it were, if the sensor signal associated therewith responds comparatively more strongly to manual control gestures of the user, while the other of the sensor electrodes can serve as an "appliance electrode", as it were, if the sensor signal associated therewith responds comparatively more strongly to interference from the appliance.

By jointly evaluating the two sensor signals, the electronic assembly can accordingly determine whether specific observed signal curves of the sensor signals of the two sensor electrodes are attributable to a proper control gesture of the user (i.e. proximity operation) or are merely the result of interfering influences which are undesirable but often unavoidable in practice. For example, undesirable vibrations can occur if a user inadvertently hits the domestic appliance with his leg or his arm. In the case of such accidental occurrences, operation of the control device is of course not to be determined by the electronic assembly. This should take place only if the electronic assembly, by considering the sensor signals of both sensor electrodes together, determines that operation of the control device has actually taken place. The mutual correlation of the two sensor signals can comprise, for example, a qualitative or/and quantitative comparison of the signal magnitudes of the two sensor signals. Alternatively or in addition, the mutual correlation of the two sensor signals can comprise an analysis of temporal signal patterns of the sensor signals. For example, it is conceivable that mechanical vibrations lead to a series of multiple, comparatively short-lasting signal peaks (in particular in the case of signal sampling of the capacitor capacitance or of a parameter derived therefrom with a sampling frequency that is smaller than the vibration frequency and also is not a natural divisor of the vibration frequency), while a control gesture performed for the purpose of operation leads to a signal increase that lasts for a longer time but is continuous, that is to say a signal curve that is "smoother" overall. Provided that such characteristic signal patterns are identifiable (i.e. characteristic of a specific cause of capacitance changes), they can of course be taken into consideration in the signal evaluation.

For electrically shielding the two sensor electrodes from one another, the proximity control device can have a shielding electrode, which in particular is likewise of planar form, arranged in the spatial region between the two sensor electrodes. An electric ground potential of the domestic appliance or a suitable other electric potential can be applied to the shielding electrode.

The invention additionally provides a domestic electrical appliance which comprises an appliance main body having a process chamber (e.g. washing chamber, drying chamber, dishwashing chamber, cooking chamber) formed therein, a door, arranged so as to be movable relative to the appliance main body, for closing an access opening to the process chamber, a proximity control device of the type discussed above, and an electronic control unit which is adapted to effect a predetermined response in dependence on the determination of a proximity operation of the proximity control device. The domestic appliance is, for example, a washing machine, a tumble dryer or a washer-dryer. A washer-dryer is understood as being a machine which combines the functions of a washing machine and a tumble dryer.

The predetermined response can be any operation which can be initiated in a domestic electrical appliance by a user by means of a suitable manual proximity control gesture and in particular is to be able to be performed under electrical control. In some embodiments, the predetermined response comprises automatic opening of the closed door. If a proximity operation is detected by the electronic assembly of the control device, the control unit can suitably control an electronically controllable door opening mechanism of the domestic appliance, for example, in order to push the door open against the holding-closed force of a mechanical door latch of the domestic appliance. In other embodiments, the predetermined response comprises another appliance function, for example switching on ("waking up") the domestic appliance or starting or stopping the performance of an operating program of the domestic appliance.

Not only, but in particular when the proximity control device is to have a function of opening the door of the domestic appliance, the sensor electrodes can be arranged on the door. The sensor electrodes can thereby be arranged in the region of a circumferential edge of the door, wherein they are configured to be elongate in the circumferential direction of the door and overlap one another. The elongate form of the sensor electrodes allows a comparatively large control panel to be produced for the user. In laundry treatment appliances of the front loader type (i.e. having a round door, sometimes designed with a bull's-eye window, arranged on a front side of the machine), the sensor electrodes can extend in an arcuately curved manner along the door circumference.

As explained, the proximity control device according to the invention is suitable for installation in particular where the domestic appliance has metal material in spatial proximity to the installation location of the control device, which can adversely affect the capacitance of a capacitive sensor in the sense of an interfering influence. Accordingly, some embodiments provide that the sensor electrodes are arranged on a side of the appliance on which the appliance main body has a metallic housing wall.

The sensor electrodes can thereby be arranged on the door in a position such that, when the door is closed, one of the sensor electrodes is arranged closer to the metallic housing wall than the other of the sensor electrodes. By means of such a relative arrangement of the sensor electrodes in relation to the metallic housing wall, it is possible for the metallic housing wall to have an interfering influence of different intensity on the sensor signals of the two sensor electrodes.

The invention will be explained further hereinbelow with reference to the accompanying drawings, in which:

FIG. 1 shows, schematically, a domestic washing machine of the front loader type according to an exemplary embodiment, FIG. 2 shows an enlarged detail of the washing machine of FIG. 1 with the door partly open, and FIG. 3 is an electric circuit diagram of a proximity control device according to an exemplary embodiment provided in the washing machine of FIGS. 1 and 2.

Reference will first be made to FIG. 1. The washing machine illustrated therein in highly schematic form and denoted generally 10 has a machine body (appliance main body) 12 in which a washing chamber, not shown in greater detail in FIG. 1, for receiving washing to be cleaned is formed. The washing chamber can be formed in a manner known per se in a washing drum which is rotatably received in a liquor container which is received in the interior of a body housing 14 forming the visible outer surface of the machine body 12. In a front wall 16 of the machine body 12 there is formed an access opening 18 to the washing chamber. A door 20, which is typically in the form of a bull's-eye door, is mounted on the machine body 12 so as to be pivotable about a vertical pivot axis and allows the access opening 18 to be closed. The access opening 18 is indicated only by a broken line in FIG. 1, since it is concealed by the door 20, which is depicted as closed. Although not shown in greater detail in FIG. 1, it is conventional in washing machines of the type shown in FIG. 1 that a bead-like door seal is attached to the front wall 16 around the access opening 18, which seal is compressed on closing of the door 20 and thereby seals the washing chamber towards the outside against the escape of water when the door 20 is closed.

In order to hold the door 20 closed once it has been brought into a closed position in which the access opening 18 is closed, the washing machine 10 is equipped with a door latch 22. The door latch 22 is of the pull-latch type, for example, which allows a user to open the door 20 simply by pulling the closed door. In some embodiments, the user must pull the door with a force that is sufficiently great to overcome a holding-closed force of the door latch 22. The holding-closed force of the door latch 22 is based, for example, on at least one closing spring (not shown in greater detail), which relaxes on closing of the door 20 and must be placed under (increased) tension again in order to open the door latch 22. The relaxation of the closing spring on closing of the door 20 has the effect of pulling the door 20 closed, as a result of which the door 20 is pulled more tightly against the machine body 12 against the resistance of the mentioned door seal. Such pull-latches are also referred to as push-pull latches.

The washing machine 10 further comprises an electrically controlled door opener 24 which provides a function of automatically pushing the closed door 20 open. The door opener 24 and the door latch 22 can be separate, mechanically independently functional units, or they can be combined in a structural unit. Automatically here means that the user does not have to pull the door 20 himself with his own hand or push against it. Activation of the door opener 24 can take place under the control of a program; in the exemplary embodiment under consideration here, there is additionally arranged on the door 20 a control panel 25 (see FIG. 2), which is part of a proximity control device which allows the user to activate the door opener 24 to open the door 20 as he wishes.

In FIG. 1, the door latch 22 and the door opener 24 are shown in close proximity to one another, wherein they are arranged substantially diametrically opposite a hinge point at which there is located a pivot hinge (not shown in greater detail) of the door 20, by means of which the door 20 is mounted on the machine body 12. Such an arrangement of the door latch 22 and the door opener 24 is of course purely by way of example and not limiting. An example of an alternative position for the door opener 24 is depicted by a broken line at 24' in FIG. 1, in which position the door opener is arranged with an angular offset of approximately a quarter of a circle with respect to the door latch 22.

The door opener 24 is electrically controlled by a control unit, indicated at 26, of the washing machine 10. For example, at the end of an operating cycle of the washing machine 10, the control unit 26 can control the door opener 24, under the control of a program, to open the door 20 so that moisture, or hot steam, can escape from the washing chamber and the laundry in the washing chamber does not become musty. On opening of the door 20, the door opener 24 must overcome a certain holding force (holding-closed force) of the door latch 22, which tries to hold the door 20 closed. The door opener 24 can additionally be activated by the user touching the control panel 25 with his hand or moving his hand sufficiently close to the control panel 25 that a capacitive proximity control device 28 (FIG. 3) detects a proximity operation of the proximity control device 28. The electrical construction of the proximity control device 28 will be explained in detail hereinbelow. Firstly, however, FIG. 2 will be explained.

According to FIG. 2, the door 20 is in the form of a bull's-eye door with a bull's-eye window 30. The bull's-eye window 30 is surrounded by an annular window frame 32, which is conventionally made of a plastics material, on which the control panel 25 is arranged. The control panel 25 can be formed by a separate sensor module set into the window frame 32; alternatively, it is conceivable that the control panel 25 is merely a region of the window frame 32 that is visually emphasized for the user. The primary function of the control panel 25 is to define a visually perceivable, delimited region which the user interprets as a region which acts to detect a control gesture by means of sensors. In the region of the control panel 25, an arrangement of two sensor electrodes 34, 36 (indicated by broken lines) is accommodated in a concealed manner in the window frame 32, which sensor electrodes are of strip-like elongate form in the example shown. The sensor electrodes 34, 36 can be mounted, for example, at a distance from one another on a common carrier component (not shown), which in turn is set into the window frame 32. A sensor module which contains the carrier component and the two sensor electrodes 34, 36 (and optionally an additional shielding electrode) can thus be prefabricated and mounted as a prefabricated module on the domestic appliance, here the washing machine 10. The carrier component can be formed, for example, by a profiled rod, which is arcuately curved according to the circumferential profile of the door 20. Alternatively, a printed circuit board could serve as the carrier component, wherein conductor track faces formed on the printed circuit board can form the sensor electrodes 34, 36.

In the example shown, the sensor electrodes 34, 36 extend in the circumferential direction of the door 20, wherein their circumferential length is, for example, at least 5 cm or at least 10 cm or at least 15 cm or at least 20 cm. Alternatively, it is conceivable to configure the sensor electrodes 34, 36 and install them in the door 20 in such a manner that they are elongate in the radial direction (based on a mid-point of the door 20).

The distance between the sensor electrodes 34, 36 is, for example, several millimeters or a few centimeters. The sensor electrodes 34, 36 are, for example, formed of metallic foil pieces or metal pieces of a sufficiently conductive metal material (e.g. aluminum or silver); alternatively, they can be formed by conductive tracks on a printed circuit board. The two sensor electrodes 34, 36 can be in the form of plate-type electrodes, for example, or they can be in the form of electrodes that are profiled, for example L-shaped or C-shaped, in cross section.

The sensor electrodes 34, 36 can be installed in the door 20 so that they overlap. This means an overlap such that, when the door 20 is closed, the two sensor electrodes 34, 36 are arranged one behind the other from the point of view of a user standing in front of the front wall 16 of the washing machine 10, that is to say one in front, the other behind. From the point of view of such a user, one of the sensor electrodes 34, 36 (in the example shown in FIG. 2 the sensor electrode 34) is a front electrode, while the other of the sensor electrodes 34, 36 (in the example shown in FIG. 2 the sensor electrode 36) is a rear electrode. The front sensor electrode 34 is thus closer to the imaginary user and consequently, when the door 20 is closed, is at a slightly greater distance from the front wall 16 of the machine body 12 than the rear sensor electrode 36. Assuming that the front wall 16 consists at least for a large part of a metal material, the (interfering) influence of the front wall 16 on an electric field generated by the rear sensor electrode 36 is greater than the influence of the front wall 16 on an electric field generated by the front sensor electrode 34. Vibrations which can occur at the front wall 16 if the user hits the front wall 16 with his knee, for example, then cause capacitance changes to a lesser degree in a (an open) capacitor formed by the front sensor electrode 34 than in a (an open) capacitor formed by the rear sensor electrode 36.

A mutual overlap of the sensor electrodes 34, 36 is not a necessity, however. For example, if the door 20 must be expected to be able to wobble about a particular axis when it is closed, the sensor electrodes 34, 36 can be arranged on either side of that axis, for example mirror symmetrically. Wobbling movements of the door 20 would then be reflected in the sensor signals of the two sensor electrodes 34, 36 with a phase offset relative to one another. A proximity control gesture, on the other hand, would have a significantly different effect on the sensor signals of the two sensor electrodes 34, 36. In this manner, by considering the sensor signals of both sensor electrodes 34, 36 together, a proximity operation of the control device 28 could be distinguished, for example, from unintentional or undesirable wobbling of the door 20.

Conversely, the front sensor electrode 34 is exposed to a greater extent than the rear sensor electrode 36 to capacitance changes that occur when the user moves his hand towards the control panel 25 with the intention of effecting opening of the closed door 20. By suitably dimensioning and configuring the sensor electrodes 34, 36, it is accordingly possible, by considering together two sensor signals which each represent the capacitance changes of one of the sensor electrodes 34, 36, to reliably distinguish the two cases where capacitance changes are caused by vibrations of the front wall 16 or by a hand of a user moving closer to the control panel 25.

In the example shown in FIG. 2, the control panel 25 with the two sensor electrodes 34, 36 is arranged approximately at the 3 o'clock position of the door 20. It will be appreciated that the control panel 25 can optionally be arranged at other positions along the circumference of the door 20, for example at the 6 o'clock position.

There can additionally be seen in FIG. 2 a latch assembly 38, which is part of the door latch 22 and has an insertion opening 40 into which a closing stirrup 42 arranged on the door 20 is inserted on closing of the door 20. The closing stirrup 42 has a front stirrup web 44 which, on closing of the door 20, is gripped by a gripper, not shown in greater detail here, contained in the assembly 38. For example, the door latch 22 formed by the latch assembly 38 and the closing stirrup 42 can have a configuration as is shown and described in DE 198 37 248 A1. The content of this DE specification is incorporated by reference herein in its entirety.

In the example shown, the door opener 24 comprises a push button 45, arranged on the machine body 12, which is adjustable between a retracted position and an advanced position (FIG. 2) and which, when the door 20 is closed, is able to push the door 20 open by moving forwards into the advanced position.

Reference will now additionally be made to FIG. 3. According to the circuit diagram shown therein, a positive electric DC potential $+U_1$ or $+U_2$ is applied to the sensor electrodes 34, 36. It will be appreciated that, instead of a positive DC potential, a negative DC potential can be applied to the sensor electrodes 34, 36. The potentials applied to the two sensor electrodes 34, 36 can have the same sign or different signs and can be the same or different in magnitude. The two sensor electrodes 34, 36 are connected to an electronic assembly 48 which generates, in association with each of the sensor electrodes 34, 36, an electrical sensor signal which is representative of a capacitance change of an open plate-type capacitor formed by the sensor electrode 34, 36 in question. To this end, the electronic assembly 48 can comprise in a manner known per se, for example, an RC oscillator circuit in association with each of the sensor electrodes 34, 36, wherein the sensor electrode 34 or 36 in question is part of the oscillator circuit capacitor. The electronic assembly 48 can be arranged on the machine body 12 and connected to the sensor electrodes 34, 36 via wires (not shown in greater detail) which are guided via the pivot hinge of the door 20.

As a result of the movement of a finger or other part of the hand towards the proximity control device 28 (from the left in the illustration of FIG. 3), the capacitance of each of the capacitors formed by the sensor electrodes 34, 36 changes, wherein in the configuration of the proximity control device 28 that is shown, the capacitance change is in the same direction in both capacitors (e.g. becomes greater as the finger moves increasingly closer) and is reflected in a change in the oscillation frequency of the two oscillator circuits that is correspondingly in the same direction. However, because the sensor electrodes 34, 36 are at different distances from the approaching finger, the degree of the capacitance change in the two sensor electrodes 34, 36 is different.

If the front wall 16 begins to vibrate, this can also cause a capacitance change of the two capacitors in the same direction but of differing intensity. By evaluating the oscillation behavior of both oscillator circuits, the electronic assembly 48 can determine whether the observed oscillation frequency changes were caused by a manual control gesture of the user or by vibrations of the front wall 16. Correspondingly, the electronic assembly 48 can detect whether a proper (i.e. manual) proximity operation of the proximity control device 28 has taken place or whether the intensity or/and temporal curve or/and other characteristics of observed oscillation frequency changes of the oscillator circuits lead to the conclusion that an intentional operation of the proximity control device 28 is not present.

The result of the evaluation can be transmitted by the electronic assembly 48 to the control unit 26, which can respond in a defined manner in dependence on the communicated evaluation result (if a proximity operation is communicated). For example, the control unit 26, as explained, can effect automatic opening of the door 20 when a proximity operation of the proximity control device 28 is communicated.

The proximity control device 28 can additionally have a shielding electrode 50 arranged between the two sensor electrodes 34, 36, which shielding electrode is at electric ground potential in the example shown. An electric potential other than ground potential can of course be chosen for the shielding electrode 50. The shielding electrode 50 is fitted into the window frame 32 of the door 20 together with the sensor electrodes 34, 36 and can be part of the mentioned sensor module.

The invention claimed is:

1. A domestic electrical appliance comprising:
   an appliance main body having a process chamber formed therein;
   a door, arranged so as to be movable relative to the appliance main body, for closing an access opening to the process chamber;
   a proximity control device configured to detect a proximity control gesture of a user; and
   an electronic control unit;
   wherein the proximity control device comprises:
      a pair of planar sensor electrodes arranged with a mutual spatial distance, wherein each of the pair of sensor electrodes forms a capacitor electrode of a plate-type capacitor, wherein the capacitor electrodes are arranged sufficiently close to one another such that, when a manual proximity control gesture is performed by the user, the two sensor signals show a signal curve in which the manual proximity control gesture is reflected, wherein the sensor electrodes are installed in the door so as to overlap such that the two sensor electrodes are arranged one behind the other and one of the sensor electrodes is arranged spatially closer to a control surface of the proximity control device than the other of the sensor electrodes, wherein said relative arrangement of the sensor electrodes in relation to the control surface allows for the proximity control gesture to be reflected in signal changes of the two sensor signals in a same direction, and wherein a signal amplitude of the sensor signal of one sensor electrode is greater than a corresponding signal amplitude of the sensor signal of the other sensor electrode;

a shielding electrode in a spatial region between the pair of sensor electrodes; and an electronic assembly connected to the two sensor electrodes, wherein the electronic assembly is configured to generate, in association with each of the pair of sensor electrodes, an electrical sensor signal which is representative of a change in a capacitance associated with the respective sensor electrode and, by mutual correlation of the two sensor signals, to determine a manual proximity control gesture or other proximity operation of the control device; and wherein the electronic control unit is configured to cause a predetermined response in dependence on the determination of a proximity operation of the proximity control device.

2. The domestic electrical appliance of claim 1, wherein the predetermined response comprises automatic opening of the closed door.

3. The domestic electrical appliance of claim 1, wherein the sensor electrodes are mounted on the door and are in strip-like elongate form, wherein the sensor electrodes are arranged in the region of a circumferential edge of the door and extend in the circumferential direction of the door or in the radial direction.

4. The domestic electrical appliance of claim 1, wherein the sensor electrodes are arranged on a side of the appliance on which the appliance main body has a metallic housing wall.

5. The domestic electrical appliance of claim 4, wherein the sensor electrodes are arranged on the door in a position such that, when the door is closed, one of the sensor electrodes is arranged closer to the metallic housing wall than the other of the sensor electrodes.

6. The domestic electrical appliance of claim 1, wherein the appliance is one of a washing machine, a tumble dryer and a washer-dryer.

* * * * *